US009975179B2

(12) United States Patent
Czinger et al.

(10) Patent No.: US 9,975,179 B2
(45) Date of Patent: May 22, 2018

(54) SYSTEMS AND METHODS FOR FABRICATING JOINT MEMBERS

(71) Applicant: Divergent Technologies, Inc., Los Angeles, CA (US)

(72) Inventors: Kevin R. Czinger, Greenwich, CT (US); William Bradley Balzer, Santa Monica, CA (US); Praveen Varma Penmetsa, Long Beach, CA (US); Zachary Meyer Omohundro, Hermosa Beach, CA (US); Matthew M. O'Brien, Hermosa Beach, CA (US)

(73) Assignee: Divergent Technologies, Inc., Los Angeles, CA (US)

( * ) Notice: Subject to any disclaimer, the term of this patent is extended or adjusted under 35 U.S.C. 154(b) by 0 days. days.

(21) Appl. No.: 14/788,154

(22) Filed: Jun. 30, 2015

(65) Prior Publication Data
US 2016/0016229 A1    Jan. 21, 2016

Related U.S. Application Data

(60) Provisional application No. 62/020,084, filed on Jul. 2, 2014.

(51) Int. Cl.
*B60N 99/00*     (2006.01)
*B22F 3/105*     (2006.01)
(Continued)

(52) U.S. Cl.
CPC .............. *B22F 3/1055* (2013.01); *B22F 5/10* (2013.01); *B62D 21/17* (2013.01); *B62D 23/005* (2013.01);
(Continued)

(58) Field of Classification Search
CPC .. B22F 3/1055; B22F 5/10; B22F 2003/1057; B62D 27/023; B62D 23/005;
(Continued)

(56) References Cited

U.S. PATENT DOCUMENTS

| 2,421,351 A | 5/1947 | Page |
| 3,292,969 A | 12/1966 | Eggert, Jr. |

(Continued)

FOREIGN PATENT DOCUMENTS

| CA | 2818928 A1 | 6/2012 |
| CN | 201400267 Y | 2/2010 |

(Continued)

OTHER PUBLICATIONS

Architecture>Grasshopper (online). Andrea Springer, 2013. Accessed Oct. 21, 2015. Retrieved from the internet: http://www.andreaspringerstudio.com/architecture/grasshopper/.

(Continued)

*Primary Examiner* — Lori L Lyjak
(74) *Attorney, Agent, or Firm* — Arent Fox LLP

(57) ABSTRACT

A method for fabricating a joint designed to connect tubes for a space frame, where a space frame may be a vehicle chassis, is provided. The method may generate joints with variable geometry and fine features which may reduce production costs, reduce production time, and generate joints configured for highly specific applications. The joint may include centering features which may create a space between a surface of the tube and a surface of the joint through which adhesive may flow.

17 Claims, 9 Drawing Sheets

(51) Int. Cl.

| | | |
|---|---|---|
| *B22F 5/10* | (2006.01) | |
| *B62D 21/17* | (2006.01) | |
| *B62D 23/00* | (2006.01) | |
| *G06F 17/50* | (2006.01) | |
| *B62D 27/02* | (2006.01) | |
| *B29C 64/386* | (2017.01) | |
| *B29L 31/24* | (2006.01) | |
| *B33Y 50/02* | (2015.01) | |
| *B33Y 80/00* | (2015.01) | |

(52) U.S. Cl.
CPC ....... *B62D 27/023* (2013.01); *G06F 17/5095* (2013.01); *B22F 2003/1057* (2013.01); *B29C 64/386* (2017.08); *B29L 2031/24* (2013.01); *B33Y 50/02* (2014.12); *B33Y 80/00* (2014.12); *Y02P 10/295* (2015.11)

(58) Field of Classification Search
CPC ... B62D 21/17; G06F 17/5095; Y02P 10/295; B29L 2031/24; B29C 67/0088; B33Y 80/00; B33Y 50/02
See application file for complete search history.

(56) References Cited

U.S. PATENT DOCUMENTS

| | | | |
|---|---|---|---|
| 3,665,670 A | | 5/1972 | Rummler |
| 3,756,635 A | * | 9/1973 | Beers .................. F16B 11/008 312/111 |
| 4,259,821 A | * | 4/1981 | Bush ...................... B64G 9/00 244/159.4 |
| 4,557,097 A | * | 12/1985 | Mikulas, Jr. .......... E04H 12/185 16/242 |
| 4,583,755 A | * | 4/1986 | Diekman .............. E04H 12/185 162/242 |
| 4,660,345 A | * | 4/1987 | Browning .............. B62D 21/08 164/63 |
| 4,721,407 A | | 1/1988 | King |
| 4,735,355 A | * | 4/1988 | Browning .............. B62D 21/08 228/138 |
| 4,804,209 A | | 2/1989 | Fischer |
| 4,950,522 A | | 8/1990 | Vogt |
| 5,116,071 A | | 5/1992 | Calfee |
| D331,378 S | * | 12/1992 | Muller ........................ D12/117 |
| 5,272,805 A | | 12/1993 | Akeel et al. |
| 5,346,237 A | | 9/1994 | Wang |
| 5,478,100 A | * | 12/1995 | McDermitt, Jr. ...... B62K 19/06 280/281.1 |
| 5,720,092 A | | 2/1998 | Ni et al. |
| 5,720,511 A | * | 2/1998 | Benedyk ................. B60N 2/68 280/281.1 |
| 5,848,853 A | | 12/1998 | Clenet |
| 5,917,726 A | | 6/1999 | Pryor |
| 5,944,441 A | | 8/1999 | Schutze |
| 6,010,182 A | | 1/2000 | Townsend |
| 6,170,596 B1 | | 1/2001 | Triarsi et al. |
| 6,247,869 B1 | | 6/2001 | Lichvar |
| 6,349,237 B1 | | 2/2002 | Koren et al. |
| 6,412,857 B2 | * | 7/2002 | Jaekel .................. B62D 23/005 296/203.04 |
| 6,470,990 B1 | * | 10/2002 | Panoz .................... B62D 23/00 180/311 |
| 6,665,935 B2 | | 12/2003 | Panoz |
| 7,000,936 B2 | * | 2/2006 | Schmider .............. B62K 21/00 280/281.1 |
| 7,044,535 B2 | * | 5/2006 | Durand ................ B62D 23/005 296/203.01 |
| 7,133,812 B1 | | 11/2006 | Weber |
| 7,270,346 B2 | | 9/2007 | Rowe et al. |
| 7,341,285 B2 | | 3/2008 | McPherson |
| 8,070,216 B2 | | 12/2011 | Defoy et al. |
| 8,317,257 B2 | | 11/2012 | Rolfe et al. |
| 8,528,291 B2 | | 9/2013 | Allred et al. |
| 8,530,015 B2 | | 9/2013 | Mendiboure |
| 8,544,587 B2 | | 10/2013 | Holroyd et al. |
| 8,590,654 B2 | | 11/2013 | Kerner et al. |
| 8,998,307 B1 | | 4/2015 | Joyce |
| 9,567,013 B2 | | 2/2017 | Ehrlich et al. |
| 2003/0102668 A1 | | 6/2003 | Tarbutton et al. |
| 2003/0230443 A1 | | 12/2003 | Cramer et al. |
| 2005/0046166 A1 | | 3/2005 | Reim et al. |
| 2005/0280185 A1 | | 12/2005 | Russell et al. |
| 2007/0222257 A1 | | 9/2007 | Flendrig |
| 2009/0014121 A1 | | 1/2009 | McPherson |
| 2010/0288569 A1 | | 11/2010 | Fish |
| 2011/0167758 A1 | | 7/2011 | Daadoush |
| 2013/0081249 A1 | | 4/2013 | McLean |
| 2013/0160295 A1 | | 6/2013 | Das et al. |
| 2014/0241790 A1 | | 8/2014 | Woleader et al. |
| 2015/0052025 A1 | | 2/2015 | Apsley et al. |
| 2015/0115665 A1 | | 4/2015 | Joyce |
| 2016/0061381 A1 | | 3/2016 | Kotliar |
| 2017/0057558 A1 | | 3/2017 | Hillebrecht et al. |

FOREIGN PATENT DOCUMENTS

| | | |
|---|---|---|
| CN | 201484210 U | 5/2010 |
| CN | 103341625 A | 10/2013 |
| CN | 203887169 U | 10/2014 |
| CN | 105501299 A | 4/2016 |
| DE | 10309631 A1 | 9/2004 |
| DE | 202016105052 U1 | 4/2017 |
| EP | 0450358 A1 | 10/1991 |
| EP | 3135566 A1 | 8/2015 |
| FR | 2941166 A1 | 7/2010 |
| JP | 2004216425 A | 8/2004 |
| JP | 2011213312 A | 10/2011 |
| KR | 20160056634 A | 5/2016 |
| WO | WO-9949150 A1 | 9/1999 |
| WO | WO-0129143 A1 | 4/2001 |
| WO | WO-02090146 A2 | 11/2002 |
| WO | 2012166505 A1 | 12/2012 |
| WO | 2014028169 A2 | 2/2014 |
| WO | 2015089315 A1 | 6/2015 |
| WO | 2015118268 A1 | 8/2015 |

OTHER PUBLICATIONS

International search report and written opinion dated Oct. 6, 2015 for PCT Application No. US2015/038449.
Carbon fiber race car technology hits the streets. Published online Jul. 1, 2005. Accessed Oct. 5, 2015. http://www.compositesworld.com/articles/carbon-fiber-race-car-technology-hits-the-streets.
Chalcraft; E., "Road-ready 3D-printed car on the way. Published Mar. 7, 2013; Accessed Jul. 8, 2015. http://www.dezeen.com/2013/03/07/road-ready-3d-printed-car-on-the-way/".
George; A., "3-D Printed Car Is as Strong as Steel, Half the Weight, and Nearing Production. Published Feb. 27, 2013; Accessed Jul. 8, 2015. http://www.wired.com/2013/02/3d-printed-car/".
George; A., "The Germans Have Figured Out How to 3-D Print Cars. Published Mar. 19, 2014; Accessed Jul. 8, 2015. http://www.wired.com/2014/03/edag-3-d-printed-car/".
3D Printing Transforms the Automotive Industry. Published Jan. 20, 2016; Accessed Dec. 27, 2016. https://www.sculpteo.com/blog/2016/01/20/3d-printing-transforms-the-automotive-industry.
Design Democracy: Drones Meet 3D Printed Cars for a Self-Driven Future. Published Nov. 9, 2016; Accessed Dec. 27, 2016. https://3dprintingindustry.com/news/design-democracy-drones-meet-3d-printed-cars-self-driven-future-98125/.
LM3D Home Page. Published 2015; Accessed Dec. 27, 2016. https://localmotors.com/3d-printed-car/.
Stratasys Automotive Website. Published 2016; Accessed Dec. 27, 2016. http://www.stratasys.com/industries/automotive.
3D Prints of the World Website. Accessed Jul. 8, 2015. http://3dprintsoftheworld.com/object/vrz-1-tack-bike-frame-3d-printed-lugs.
Androole.,Custom 3D Printed Carbon Fiber Bike Frame. Accessed Jul. 8, 2015. http://www.instructables.com/id/Custom-3D-Printed-Carbon-Fiber-Bike-Frame/.

(56) References Cited

OTHER PUBLICATIONS

Coldewey, D.,Fine Ride: World's First 3-D Printed Bike Frame Weighs Just 3 Pounds. Published Feb. 14, 2014; Accessed Jul. 8, 2015. http://www.nbcnews.com/tech/innovation/fine-ride-worlds-first-3-d-printed-bike-frame-weighs-n30761.
Flying Machine Website.,3D Printed Titanium: Bike of the Future. Accessed Jul. 8, 2015. http://www.flyingmachine.com.au/3d-printed-titanium-bike-of-the-future/.
International search report and written opinion dated Aug. 24, 2015 for PCT Application No. US2015/030996.
International search report and written opinion dated Sep. 20, 2016 for PCT Application No. PCT/US2016/035893.
Extended European Search Report and European Search Opinion dated Jan. 18, 2018, regarding EP15815934.
Anonymous: "Lightweight Bike Stem using metal Additive Manufacturing", Feb. 10, 2012 (Feb. 10, 2012), XP055442489, Retrieved from the Internet: URL:https://www.3trpd.co.uk/portfolio/ligh tweight-bike-stem-using-metal-am/gallery/c onsumer-goods-case-studies/ [retrieved on Jan. 19, 2018], the whole document.
Jey Won et al: "Rapid prototyping of robotic systems", Proceedings of the 2000 IEEE International Conference on Robotics and Automation. ICRA 2000. San Francisco, CA, Apr. 24-28, 2000; [Proceedings of the IEEE International Conference on Robotics and Automation], New York, NY: IEEE, US, Apr. 24, 2000 (Apr. 24, 2000), pp. 3077-3082, XP002233177, ISBN: 978-0-7803-5887-4, p. 1, col. 2; figures 1-7.
International Search Report and Written Opinion dated Nov. 21, 2016, regarding PCT/US2016/049796.
Shury, John: "This 3D Printed Carbon Fibre Car Wants to Reinvent Manufacturing", In Composites Today [online], Jul. 16, 2015 [retrieved on Oct. 21, 2016], retrieved from the internet: <URL: http://www.compositestoday.com/2015/07/ths-3d-printed-carbon-fibre-car-wants-to-reinvent-manufacturing/>, see the entire document.
Written Opinion dated Mar. 8, 2018, regarding Singapore Application No. 11201610967.

\* cited by examiner

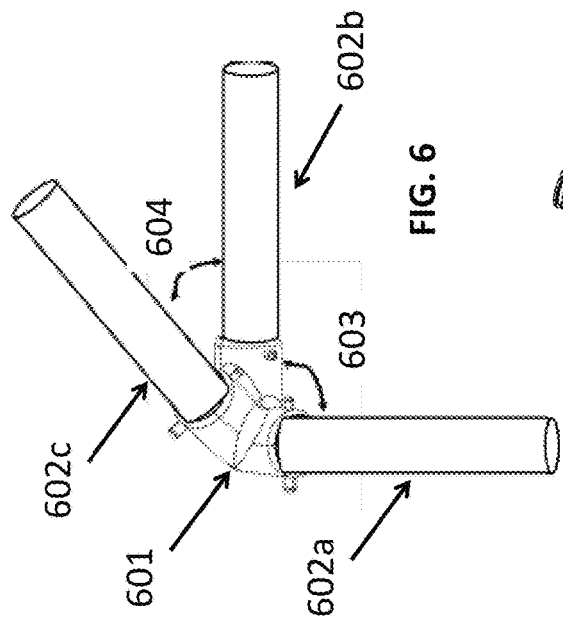
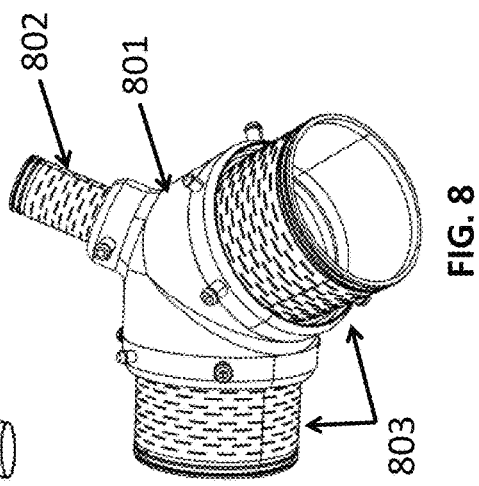
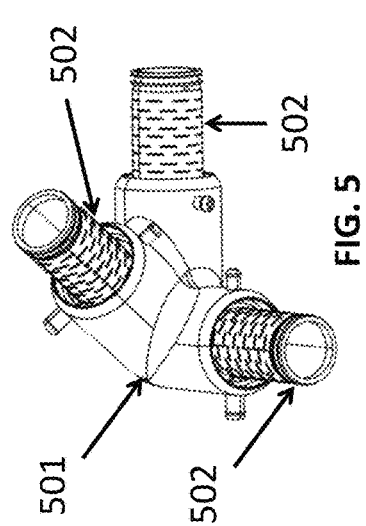
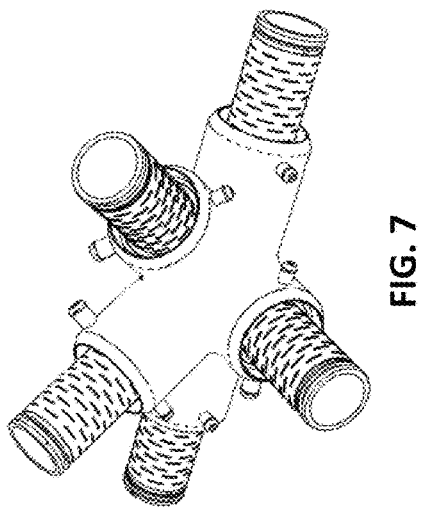

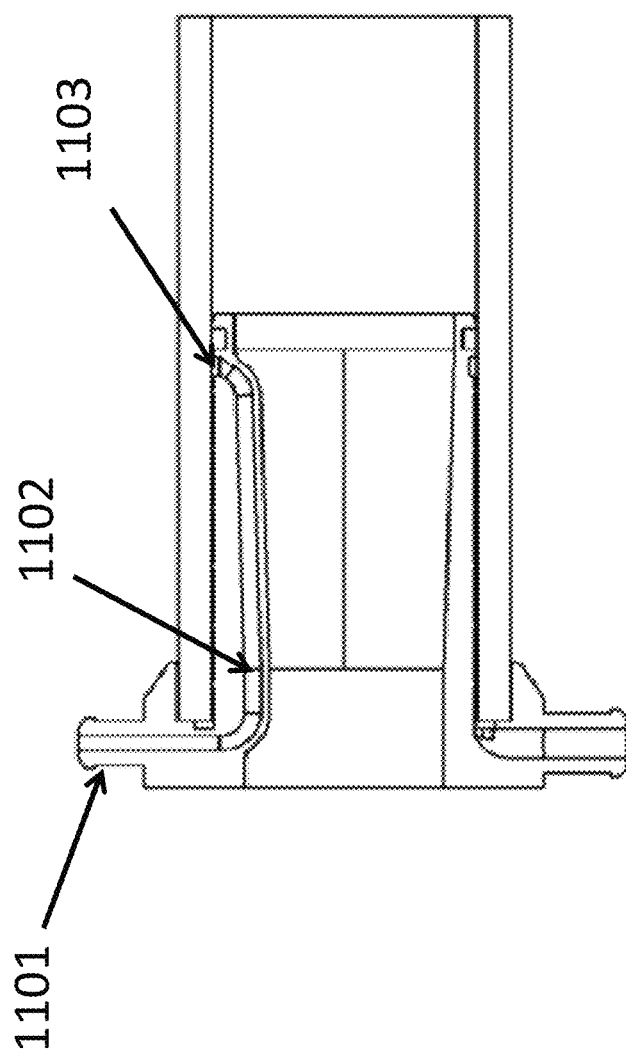

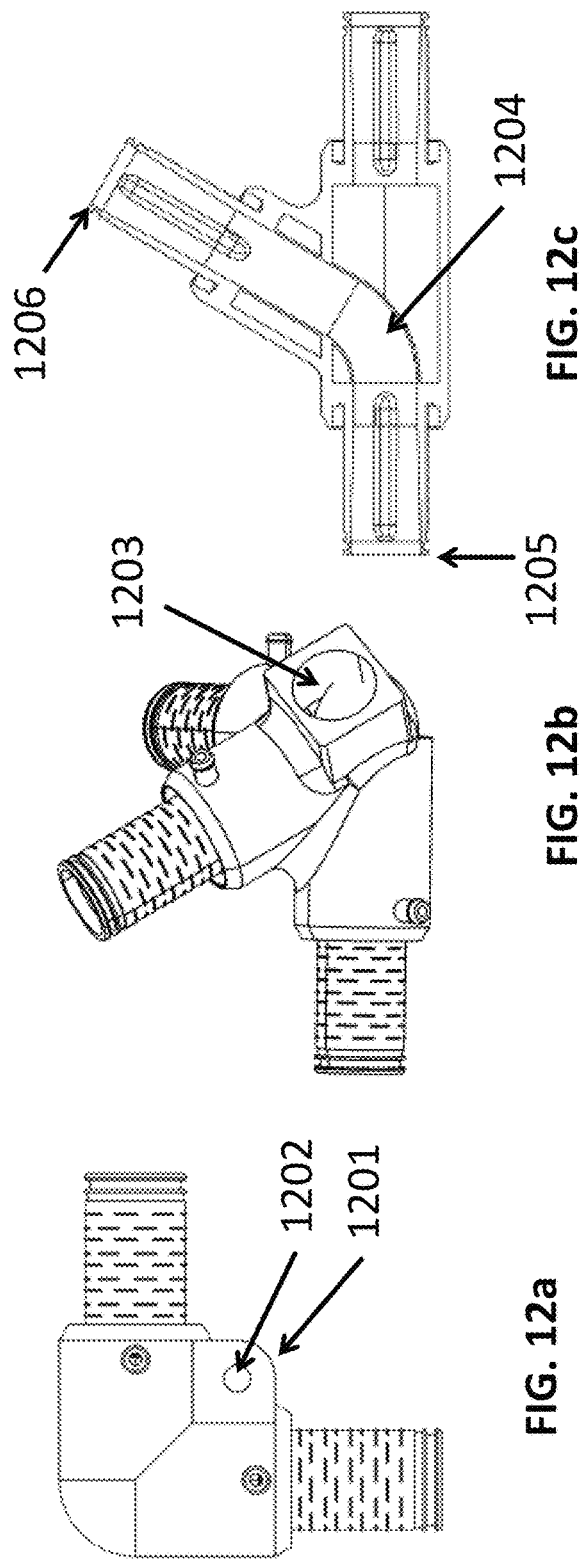

SYSTEMS AND METHODS FOR FABRICATING JOINT MEMBERS

CROSS-REFERENCE

This application claims priority to U.S. Provisional Patent Application Ser. No. 62/020,084 filed Jul. 2, 2014, which is entirely incorporated herein by reference.

BACKGROUND

Space frame construction is used in automotive, structural, marine, and many other applications. One example of space frame construction can be a welded tube frame chassis construction, often used in low volume and high performance vehicle design due to the advantages of low tooling costs, design flexibility, and the ability to produce high efficiency structures. These structures require that tubes of the chassis be connected at a wide variety of angles and may require the same connection point to accommodate a variety of tube geometries. Traditional methods fabrication of joint members for connection of such tube frame chassis may incur high equipment and manufacturing costs.

SUMMARY

A need exists for a fabrication method which may be able to generate joints to connect tubes with a variety of geometric parameters. Provided herein is a method of 3-D printing joints for the connection of tubes, such as carbon fiber tubes. The joints may be printed according to the specification of geometric and physical requirements at each tube intersection point. The method of 3-D printing the joints may reduce manufacturing costs and may be easily scaled.

The 3-D printing method described in this disclosure may allow for the printing of fine features on the joints that may not be achievable through other fabrication methods. An example of a fine feature described in this disclosure may be centering features to force the center of a connecting tube and the center of an adjoining joint protrusion to be co-axial. The centering features may provide a gap between an outer surface of inner region of a joint and an inner surface of a connecting tube, through which adhesive may be applied. Another example may be that nipples can be printed on the joint which may connect to equipment to introduce adhesive to bind a joint and tube assembly.

Aspects of the invention are directed to a method of fabricating a joint member for connection of a plurality of connecting tubes forming a space frame, the method comprising: determining a relative tube angle, tube size, and tube shape for each of the plurality of connecting tubes to be connected by the joint member; determining a stress direction and magnitude to be exerted by the plurality of connecting tubes at the joint member; and 3-D printing the joint member having a configuration that (1) accommodates the relative tube, angle, tube size, and tube shape at each joint member, and (2) supports the stress direction and magnitude exerted by the plurality of connecting tubes.

In some embodiments, the space frame is configured to at least partially encloses a three-dimensional volume. Each connecting tube of the plurality of connecting tubes may have a longitudinal axis along a different plane. The space frame may be a vehicle chassis frame.

The method may further comprise 3-D printing centering features on at least a portion of the joint member. The centering features may be printed on a joint protrusion of the joint member configured to be inserted into a connecting tube. The characteristics of the centering features can be determined based on the stress direction and magnitude to be exerted by the plurality of connecting tubes at the joint member. The stress direction and magnitude to be exerted by the plurality of connecting tubes at the joint member may be determined empirically or computationally.

An additional aspect of the invention may be directed to a vehicle chassis comprising: a plurality of connecting tubes; and a plurality of joint members, each joint member sized and shaped to mate with at least a subset of the plurality of the connecting tubes in the plurality of connecting tubes to form a three-dimensional frame structure, wherein the plurality of joint members are formed by a 3-D printer.

In some embodiments, each joint member of the plurality of joint members is sized and shaped such that the joint member contacts an inner surface and an outer surface of a connecting tube when the connecting tube is mated to the joint member. Optionally, at least one joint member of the plurality of joint members comprises internal routing features formed during 3-D printing of the joint member. The internal routing features may provide a network of passageways for transport of fluid through the vehicle chassis when the three-dimensional frame structure is formed. The internal routing features may provide a network of passageways for transport of electricity through electrical components throughout the vehicle chassis when the three-dimensional frame structure is formed.

The plurality of joint members may comprise mounting features formed during 3-D printing of the joint members. The mounting features may provide panel mounts for mounting of panels on the three-dimensional frame structure.

A system for forming a structure may be provided in accordance with an additional aspect of the invention. The system may comprise: a computer system that receives input data that describes a relative tube angle, tube size, and tube shape for each of a plurality of connecting tubes to be connected by a plurality of joint members to form a frame of the structure, wherein the computer system is programmed to determine a stress direction and magnitude to be exerted by the plurality of connecting tubes at the plurality of joint members: and a 3-D printer in communication with the computer system configured to generate the plurality of joint members having a size and shape that (1) accommodates the relative tube, angle, tube size, and tube shape at each joint member, and (2) supports the stress direction and magnitude exerted by the plurality of connecting tubes.

In some cases, the frame of the structure at least partially encloses a three-dimensional volume. The plurality of joint members may further comprise centering features on at least a portion of the joint member formed by the 3-D printer. The centering features may be printed on a joint protrusion of the joint member configured to be inserted into a connecting tube. The characteristics of the centering features may be determined based on the stress direction and magnitude to be exerted by the plurality of connecting tubes at each joint member.

Additional aspects and advantages of the present disclosure will become readily apparent to those skilled in this art from the following detailed description, wherein only illustrative embodiments of the present disclosure are shown and described. As will be realized, the present disclosure is capable of other and different embodiments, and its several details are capable of modifications in various obvious respects, all without departing from the disclosure. Accordingly, the drawings and description are to be regarded as illustrative in nature, and not as restrictive.

INCORPORATION BY REFERENCE

All publications, patents, and patent applications mentioned in this specification are herein incorporated by reference to the same extent as if each individual publication, patent, or patent application was specifically and individually indicated to be incorporated by reference.

BRIEF DESCRIPTION OF THE DRAWINGS

The novel features of the invention are set forth with particularity in the appended claims. A better understanding of the features and advantages of the present invention will be obtained by reference to the following detailed description that sets forth illustrative embodiments, in which the principles of the invention are utilized, and the accompanying drawings (also "figure" and "FIG." herein), of which:

FIG. 5 shows an example of a joint printed using the method described herein.

FIG. 6 shows a joint connected to tubes where the tubes are at non-equal angles relative to each other.

FIG. 7 shows a joint with 5 protrusions.

FIG. 8 shows a joint printed to connect with tubes of non-equal cross-section size.

FIG. 11 shows a cross section of a joint protrusion with nipples connecting to internal passageways in the side wall of the joint protrusion.

FIG. 12a-c show joints printed with integrated structural features and passageways for electrical and fluid routing.

DETAILED DESCRIPTION

While various embodiments of the invention have been shown and described herein, it will be obvious to those skilled in the art that such embodiments are provided by way of example only. Numerous variations, changes, and substitutions may occur to those skilled in the art without departing from the invention. It should be understood that various alternatives to the embodiments of the invention described herein may be employed.

This disclosure provides a method to fabricate a joint member by additive and/or subtractive manufacturing, such as 3-D printing. The joint member may be configured to provide a connection of a plurality of connecting tubes, which may be used for the construction of a lightweight space frame. A space frame can be a frame that has a three-dimensional volume. A space frame can be a frame that can accept one or more panels to at least partially enclose the frame. An example of a space frame may be a vehicle chassis. Various aspects of the described disclosure may be applied to any of the applications identified here in addition to any other structures comprising a joint/tube frame construction. It shall be understood that different aspects of the invention may be appreciated individually, collectively, or in combination with each other.

Figure 1:
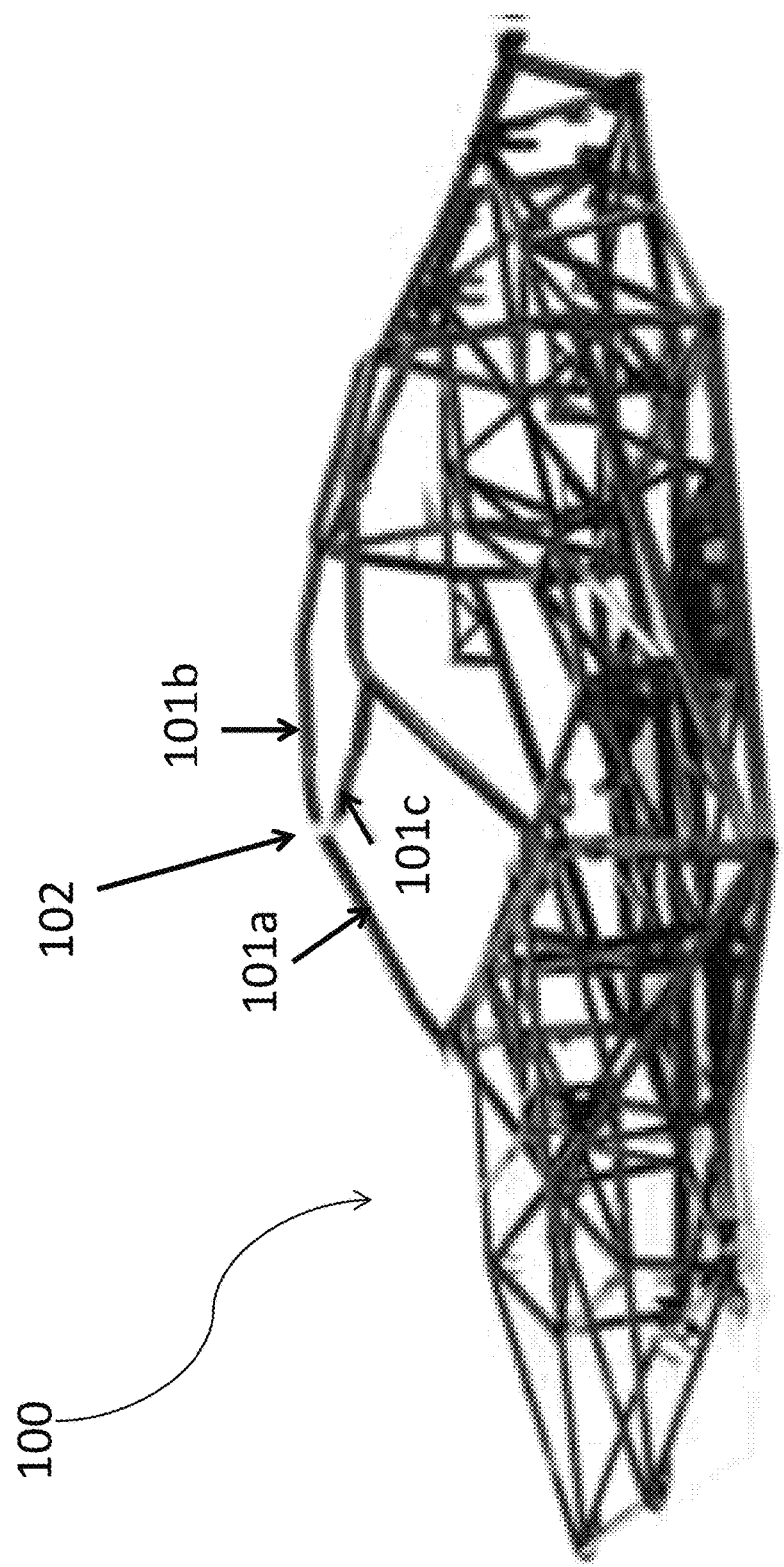
FIG. 1 shows an example of a space frame chassis constructed from carbon fiber tubes connected by 3-D printed nodes.

FIG. 1 shows a vehicle chassis 100 including connecting tubes 101a, 101b, 101c connected by one or more nodes (a.k.a. joints) 102, in accordance with an embodiment of the invention. Each joint member can comprise a central body and one or more ports that extent from the central body. A multi-port node, or joint member, may be provided to connect tubes, such as carbon fiber tubes, to form a two or three-dimensional structure. The structure may be a frame. In one example, a two dimensional structure may be a planar frame, while a three dimensional structure may be space frame. A space frame may enclose a volume therein. In some examples, a three dimensional space frame structure may be a vehicle chassis. The vehicle chassis may be have a length, width, and height that may enclose a space therein. The length, width, and height of the vehicle chassis may be greater than a thickness of a connecting tube.

A vehicle chassis may form the framework of a vehicle. A vehicle chassis may provide the structure for placement of body panels of a vehicle, where body panels may be door panels, roof panels, floor panels, or any other panels forming the vehicle enclosure. Furthermore the chassis may be the structural support for the wheels, drive train, engine block, electrical components, heating and cooling systems, seats, or storage space. A vehicle may be a passenger vehicle capable of carrying at least about 1 or more, 2 or more, 3 or more, 4 or more, 5 or more, 6 or more, 7 or more, 8 or more, ten or more, twenty or more, or thirty or more passengers. Examples of vehicles may include, but are not limited to sedans, trucks, buses, vans, minivans, station wagons, RVs, trailers, tractors, go-carts, automobiles, trains, or motorcycles, boats, spacecraft, or airplanes. The vehicle chassis may provide a form factor that matches the form factor of the type of vehicle. Depending on the type of vehicle, the vehicle chassis may have varying configurations. The vehicle chassis may have varying levels of complexity. In some instances, a three-dimensional space frame may be provided that may provide an outer framework for the vehicle. The outer framework may be configured to accept body panels to form a three-dimensional enclosure. Optionally, inner supports or components may be provided. The inner supports or components can be connected to the space frame through connection to the one or more joint members of the space frame. Different layouts of multi-port nodes and connecting tubes may be provided to accommodate different vehicle chassis configurations. In some cases, a set of nodes can be arranged to form a single unique chassis design. Alternatively at least a subset of the set of nodes can be used to form a plurality of chassis designs. In some cases at least a subset of nodes in a set of nodes can be assembled into a first chassis design and then disassembled and reused to form a second chassis design. The first chassis design and the second chassis design can be the same or they can be different. Nodes may be able to support tubes in a two or three-dimensional plane. For example, a multi-prong node may be configured to connect tubes that do not all fall within the same plane. The tubes connected to a multi-prong node may be provided in a three-dimensional fashion and may span three orthogonal axes. In alternate embodiments, some nodes may connect tubes that may share a two-dimensional plane. In some cases, the joint member can be configured to connect two or more tubes wherein each tube in the two or more tubes has a longitudinal axis along a different plane. The different planes can be intersection planes.

The connecting tubes 101a, 101b, 101c of the vehicle may be formed from a carbon fiber material, or any other available composite material. Examples of composite materials may include high modulus carbon fiber composite, high strength carbon fiber composite, plain weave carbon fiber composite, harness satin weave carbon composite, low modulus carbon fiber composite, or low strength carbon fiber composite. In alternate embodiments, the tubes may be formed from other materials, such as plastics, polymers, metals, or metal alloys. The connecting tubes may be formed from rigid materials. The connecting tubes may have varying dimensions. For example, different connecting tubes may have different lengths. For example, the connecting tubes may have lengths on the order of about 1 inch, 3 inches, 6 inches, 9 inches, 1 ft, 2 ft, 3 ft, 4 ft, 5 ft, 6 ft, 7 ft, 8 ft, 9 ft, 10 ft, 11 ft, 12 ft, 13 ft, 14 ft, 15 ft, 20 ft, 25 ft, or 30 ft. In some instances, the tubes may have the same diameter, or varying diameters. In some instances, the tubes may have diameters on the order of about 1/16", 1/8", 1/4", 1/2", 1", 2", 3", 4", 5", 10", 15", or 20".

The connecting tubes may have any cross-sectional shape. For example, the connecting tubes may have a substantially circular shape, square shape, oval shape, hexagonal shape, or any irregular shape. The connecting tube cross-section could be an open cross section, such as a C-channel, I-beam, or angle.

The connecting tubes 101a, 101b, 101c may be hollow tubes. A hollow portion may be provided along the entire length of the tube. For example, the connecting tubes may have an inner surface and an outer surface. An inner diameter for the tube may correspond to an inner surface of the connecting tube. An outer diameter of the tube may correspond to an outer diameter of the tube. In some embodiments, the difference between the inner diameter and the outer diameter may be less than or equal to about 1/32", 1/16", 1/8", 1/4", 1/2", 1", 2", 3", 4, or 5". A connecting tube may have two ends. The two ends may be opposing one another. In alternative embodiments, the connecting tubes may have three, four, five, six or more ends. The vehicle chassis frame may comprise carbon fiber tubes connected with nodes 102.

The multi-port nodes 102 (a.k.a. joints, joint members, joints, connectors, lugs) presented in this disclosure may be suitable for use in a vehicle chassis frame such as the frame shown in FIG. 1. The nodes in the chassis frame 100 may be designed to fit the tube angles dictated by the chassis design. The nodes may be pre-formed to desired geometries to permit rapid and low cost assembly of the chassis. In some embodiments the nodes may be pre-formed using 3-D printing techniques. 3-D printing may permit the nodes to be formed in a wide array of geometries that may accommodate different frame configurations. 3-D printing may permit the nodes to be formed based on a computer generated design file that comprises dimensions of the nodes.

A node may be composed of a metallic material (e.g. aluminum, titanium, or stainless steel, brass, copper, chromoly steel, or iron), a composite material (e.g. carbon fiber), a polymeric material (e.g. plastic), or some combination of these materials. The node can be formed from a powder material. The 3-D printer can melt and/or sinter at least a portion of the powder material to form the node. The node may be formed of a substantially rigid material.

A node may support stress applied at or near the node. The node may support compression, tension, torsion, shear stresses or some combination of these stress types. The magnitude of the supported stress at the node may be at least 1 Mega Pascal (MPa), 5 MPa, 10 MPa, 20 MPa, 30 MPa, 40 MPa, 50 MPa, 60 MPa, 70 MPa, 80 MPa, 90 MPa, 100 MPa, 250 MPa, 500 MPa, or 1 GPa. The type, direction, and magnitude of stress may be static and dependent on the location of the node in a frame. Alternately the stress type, direction, and magnitude may be dynamic and a function of the movement of the vehicle, for example the stress on the node may change as the vehicle climbs and descends a hill.

Figure 2:
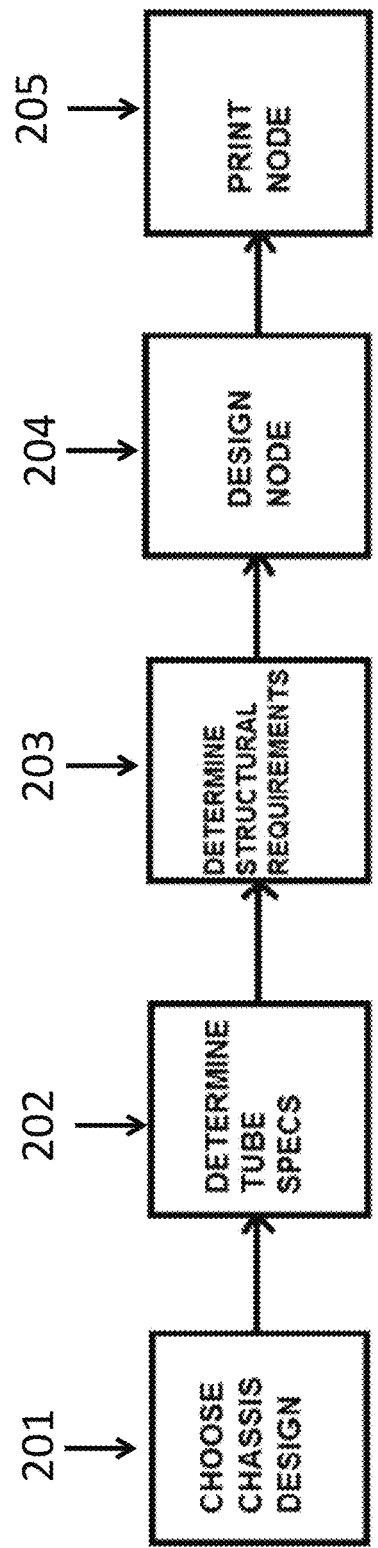
FIG. 2 shows a flow chart of the process used to design and build joints.

FIG. 2 shows a flow chart describing a method for 3-D printing joint members for connecting tubes, such as carbon fiber tubes, in a space frame. In this method a chassis design model is chosen 201. The chassis design model may be a new design or a design stored in a library which may comprise previously used designs or common stock designs. The chassis design can be generated by a user that forms the joints with the 3-D printing process or by a user that is different from the user that forms the joints. The chassis design can be editable. The chassis design can be made available through an online marketplace. From the chosen chassis design the tube specification (e.g. inner and outer diameter, tube cross section, and angle of tubes relative to each other at connection points) are determined 202. Next the dynamic and static stresses at each tube connection point are determined 203. The dynamic and static stresses at each tube connection point can be determined using a computational model, for example a finite element analysis. Using the physical and structural properties determined in steps 202 and 203 the joint (node) is designed 204. Finally in the last step the joints are generated using a 3-D printer according to the specification determined by the earlier steps 205. Two or more joints can be formed simultaneously. Alternatively joints can be formed one at a time.

A chassis design model may be generated in any available structural design software program, for example AutoCAD, Autodesk, Solid Works, or Solid Edge. The chassis design model may be generated in a simple, custom design tool tailored to the requirements of space frame design. This customized tool could interface to existing structural design software to automatically generate complete node geometries from a minimal set of input data (e.g. relative angles of tubes entering a given node). After generating a model of the chassis each tube connection point may be defined. Tube connection points may be locations where a joint is used to connect two or more tubes. Characteristics of the tube connection points may be determined by the model and used to define the joint structure needed for the design, for example the number of tubes, tube dimensions, and relative angles of tubes may be determined. The number of tubes at each joint may be determined from the chassis model, for example a joint may connect 2, 3, 4, 5, 6, 7, 8, 9, or 10 tubes. The diameter and cross sectional shape of each connecting tube at a joint location may be determined from the model. For example a joint may connect a square tube, round tube, oval tube, triangular tube, pentagonal tube, hexagonal tube, or an irregularly shaped tube. The tubes connected to the joint may all have the same cross section shape or they may vary. The diameter of the connecting tube may be determined from the model, a connecting tube may have a diameter of at least about 1/16", 1/8", 1/4", 1/2", 1", 2", 3", 4", 5", 10", 15", or 20". The tubes connected to the joint may all have the same diameter or the diameter may vary. The relative angles of the tubes at each joint may also be determined from the chassis model.

Optionally, a user may design a portion of the chassis design or provide specifications for the design to comply with. The software executed by one or more processors may design the rest of the chassis or provide details for the chassis in compliance with the specification. The processor may generate at least a portion of the design without requiring any further human intervention. Any of the features described herein may be initially designed by the software, a user, or both the software and the user.

Locations of additional structural, mechanical, electrical, and fluid components may also be determined from the structural design software. For example the location of shear panels, structural panels, shock systems, engine block, electrical circuits, and fluid passageways may be determined by structural design software. The chassis model may be used to define the joint design such that the joints can integrate with locations of the structural, mechanical, electrical, and fluid components.

The chassis model may be used to calculate stress direction and magnitude at each joint. The stress may be calculated using a finite element analysis employing a linear or non-linear stress model. Stress may be calculated on the joints while the chassis is stationary or while the chassis is moving along a typical path, for example, along a straight line, curved trajectory, along a smooth surface, along a rugged surface, flat terrain, or hilly terrain. The calculated stress on the joint may be shear, tensile, compressive, torsional stress, or a combination of stress types. Joints may include design features to support the calculated stresses. The design features included on the joint may be configured to comply with a specific safety standard. For example the joint may be configured to withstand the calculated stress within a factor of safety of at least 1, 2, 3, 4, 5, 10, 15, 20, 25, 30, 35, 40, 45, or 50. Joints may be designed to support tubes over a frame that may vibrate or undergo shock or impact. For example, a vehicle chassis may be driven over a road, and may experience long-term vibrations. The joints may be able to withstand the forces and stresses exerted on the joint caused by the vibrations over a long period of time. In another example, a vehicle may experience an impact if the vehicle were to hit another object. The joints may be designed to withstand the impact. In some instances, the joints may be designed to withstand the impact up to a certain predetermined degree. Optionally, it may be desirable to for the joints to deform or alter their configuration beyond the predetermined degree and absorb shock. The joints may be designed to meet various frame specifications and criteria. In some cases, the joints may be designed to form a chassis that meets state or national safety requirements for consumer and/or commercial vehicles.

Figure 3:
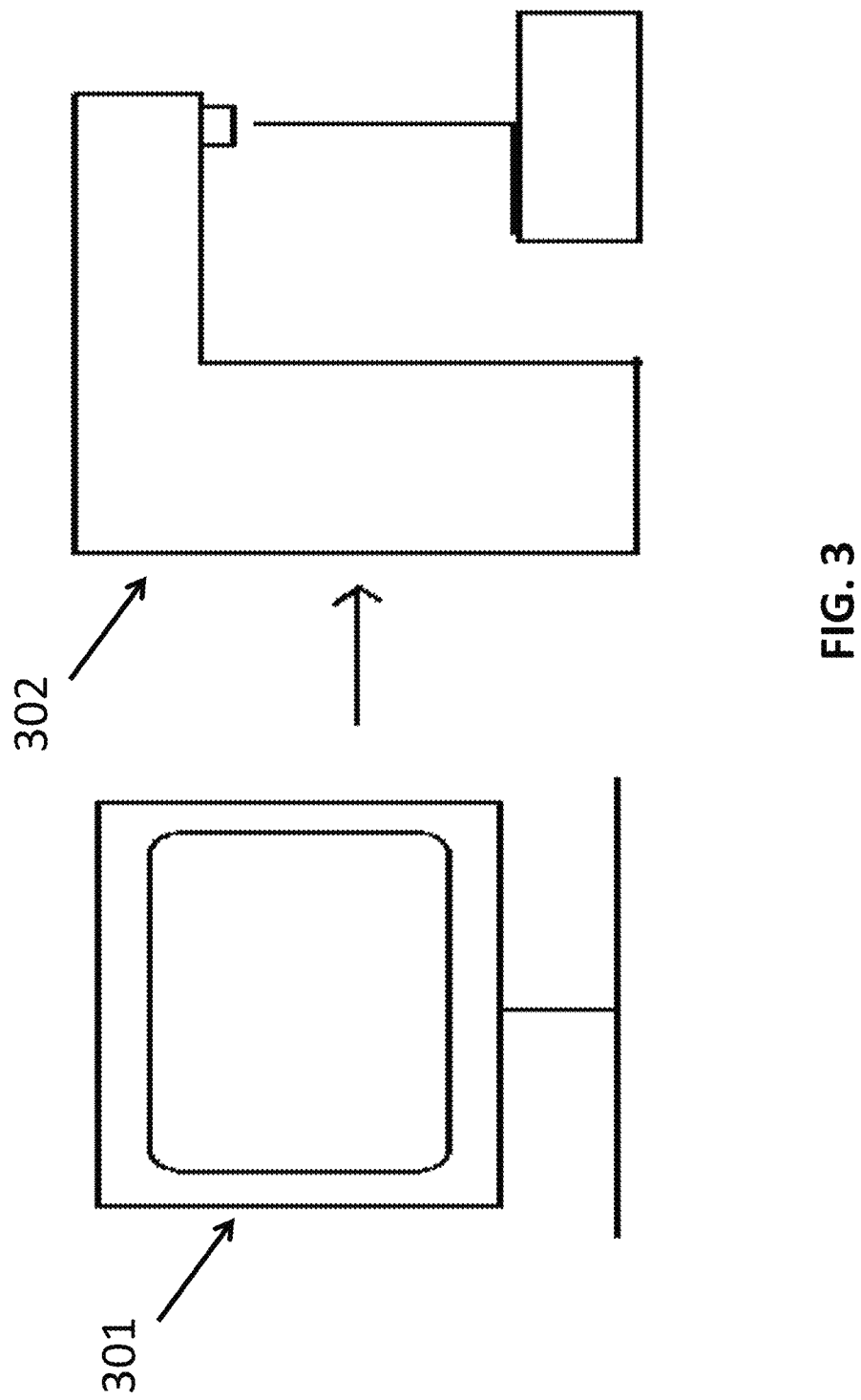
FIG. 3 shows a computer in communication with a 3-D printer.

The final joint design may be determined by the tube dimension and shape requirements, location of integrated structural, mechanical, electrical, and fluid components, and the calculated stress type and magnitude, along with any performance specifications. FIG. 3 shows a diagram of how a computational model of a joint meeting the necessary specifications may be developed in a software program on a device 301. The device may comprise a processor and/or a memory. The memory may comprise non-transitory computer readable media comprising code, logic, or instructions for performing one or more steps, such as the design steps or computations. The processor may be configured to perform the steps in accordance with the non-transitory computer readable media. The device may be a desktop computer, cell, smartphone, tablet, laptop, server, or any other type of computational device. The device may be in communication with a 3-D printer 302. The 3-D printer 302 may print the joint according to the design developed in the software program. The 3-D printer can be configured to generate an object through additive and/or subtractive manufacturing. The 3-D printer can be configured to form a metallic, composite, or polymer object. The 3-D printer may be a direct metal laser sintering (DMLS) printer, electron beam melting (EBM) printer, fused deposition modeling (FDM) printer, or a Polyjet printer. The 3-D printer may print joints made of titanium, aluminum, stainless steel, structural plastics, or any other structural material.

3-D printing may comprise a process of making a 3-dimensional structure based on a computational or electronic model as an input. The 3-D printer may employ any known printing technique including extrusion deposition, granular binding, lamination, or stereolithography. The general technique of 3-D printing may involve breaking down the design of the 3-dimensional object into a series of digital layers which the printer will then form layer by layer until the object is completed. Joints may be printed in a layer by layer fashion, and may accommodate a wide range of geometric designs and detailed features, which may include internal and external features.

The 3-D printed joints may be assembled with the tubes to form a frame structure. The design may be flexible to accommodate late design changes. For example if a support tube is added to the design late in the design process, additional joints can be printed quickly and at low cost to accommodate the additional support tube. The method of using a computer model in communication with a 3-D printer to generate joints may allow for a wide range of geometries to be produced quickly at low cost.

Figure 4:
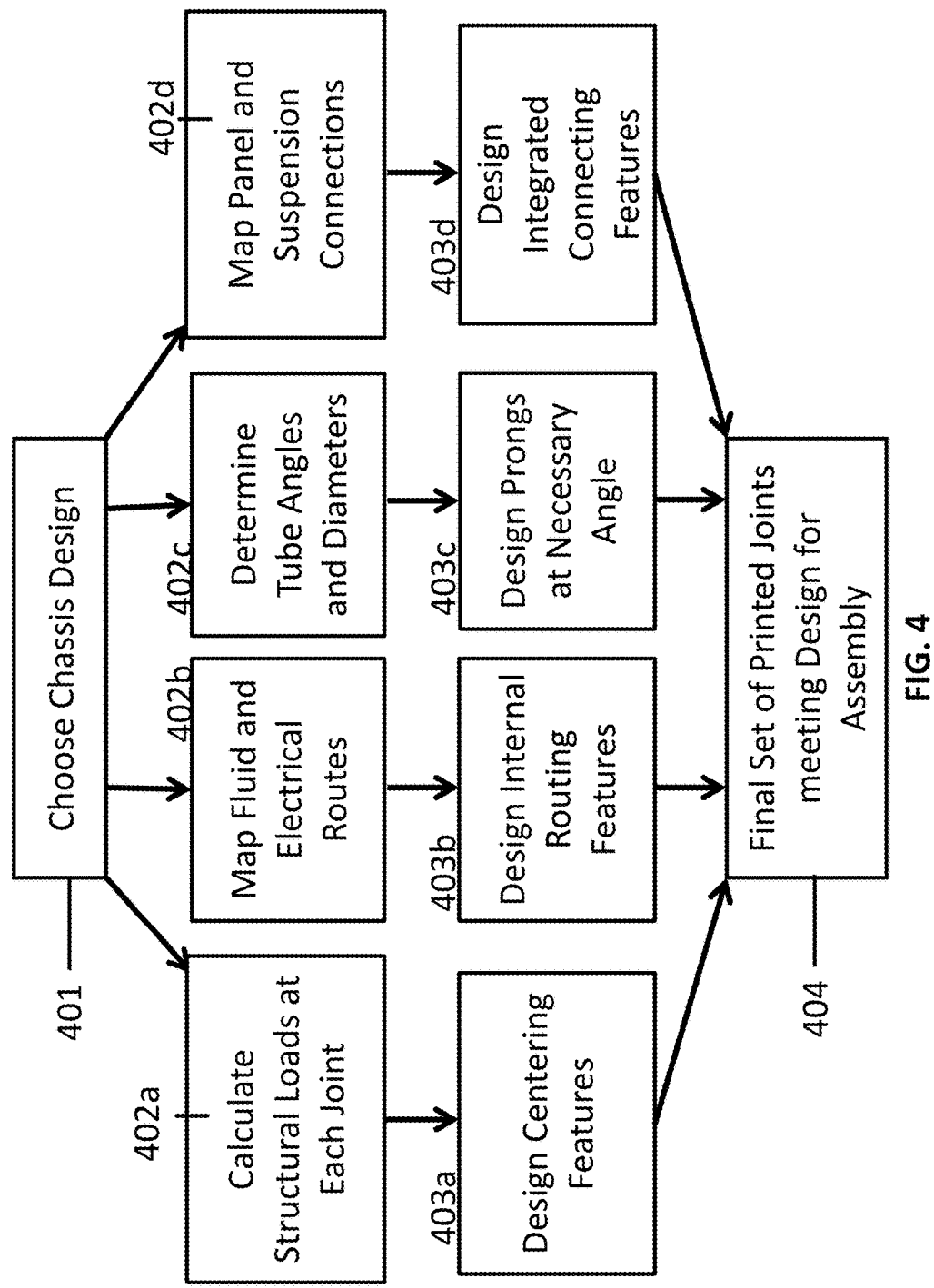
FIG. 4 shows a detailed flow chart describing how a design model may be used to generate printed joints for assembly of the given design model.

FIG. 4 shows a detailed flow chart of the method previously described. The steps described are provided by way of example only. Some steps may be omitted, completed out of order, or swapped out with other steps. Any of the steps may be performed automatically with aid of one or more processors. The one or more steps may or may not be performed with user input of intervention. The process begins with step 401, which involves choosing a frame design, such as a chassis design, the design may be chosen from a library of stored designs or it may be a new design developed for a specific project.

After the design is chosen the next steps are 402a, 402b, 402c, and/or 402d, which may include calculating structural needs or specifications for the joints of the frame. Steps 402a-d may be completed in any order, all steps 402a-d may be completed or only some of the steps may occur. Step 402a involves calculating the structural load at each joint. The structural load may be determined by a finite element method and may include the direction and magnitude of shear stresses, compressive stresses, tension stresses, torsional stress, or any combination of stresses. The stresses may be calculated assuming that the vehicle is in motion or assuming the vehicle is stationary. This may also include calculating any performance specifications, such as safety, manufacturing, durability specifications. Step 402b is to map the fluid and electrical routes throughout the vehicle. Examples of fluid passageways may include coolant, lubrication, ventilation, air conditioning, and/or heating ducts. Examples of electrical system that may require electrical routing from a source to a system may include audio systems, interior lighting systems, exterior lighting systems, engine ignition components, on board navigation systems, and control systems. Step 402c is the determination of the tube angle, shape, and size at each joint. In step 402d the structural components such as panel and suspension connections are mapped.

Following the calculation of the joint needs/specifications in steps 402a-d the joint member may be designed to accommodate the joint needs/specifications in steps 403a-d. The joint design method may comprise steps 403a-d. Steps 403a-d may be completed in any order, all steps 403a-d may be completed or only some of the steps may occur. The known stress profile at each joint may determine the wall thickness of the joint, the joint material, or necessary centering features to print on the joint 403a. After the fluid and electrical routes are mapped corresponding internal routing features may be designed to be printed on the joints 403b. The joint may have separate internal routing features for the fluid and electrical pathways or the joint may have one routing feature shared by fluid and electrical passageways. After determining the tube angle, shape, and size the joint may be designed 403c such that it can accommodate the necessary tubes while meeting the other specifications. Using the map determined in 402d, the locations of integrated connecting features are designed to be printed on the joints 403d. Such design steps may occur in sequence or in parallel. The various joint design needs may be considered in combination when designing the joint for printing. In some instances, the 3-D printing process may also be considered in designing the joint.

In the final step 404 a set of printed joints are produced for used in the frame assembly chosen in 401. The printed joints may be 3-D printed in compliance with the joint designed using the collective considerations of steps 403a-d. The printed joints may be used to complete the assembly of the chassis.

The 3-D printing method described herein adapted to fabricate joints for connecting tubes may decrease the time required to assemble a chassis. For example the total time to design and build a chassis may be less than or equal to about 15 min, 30 min, 45 min, 1 hour, 2 hours, 3 hours, 4 hours, 5 hours, 6 hours, 7, hours, 8 hours, 9 hours, 10 hours, 12 hours, 1 day, 2 days, 3 days, 4 days, 5 days, 6 days, 1 week, 2 weeks, 3 weeks, 4 weeks, or 1 month. In some instances, the printing of a joint itself may take less than or equal to about 1 min, 3 min, 5 min, 10 min, 15 min, 20 min, 30 min, 40 min, 50 min, 1 hour, 1.5 hours, 2 hours, 2.5 hours, or 3 hours. The time required to assemble a chassis may be reduced because the 3-D printing method may require fewer tools than a typical manufacturing method. In the method described herein, a single tool (e.g. 3-D printer) may be configured to fabricate a plurality of joints with different specifications (e.g., sizes/shapes). For example, a series of joints may be printed using a single 3-D printer that all have the same design. In another example, a series of joints may be printed using a single 3-D printer, the series of joints having different designs. The different designs may all belong to the same frame assembly, or may be printed for different frame assemblies. This may provide a higher degree of flexibility in scheduling joint print jobs at a site, and may permit a manufacturer to optimize production of joints to meet specified goals. In some cases, the 3-D printer can be sized and shaped such that it can be transported to a site where a vehicle is being built. Furthermore, 3-D printing may increase quality control or consistency of joints.

The manufacturing process described by FIG. 4 may reduce manufacturing time and expense. Manufacturing time and/or expenses can be reduced by reducing the number of tools required to form one or more joints. All of the joints can be formed with a single too, the 3-D printer. Similarly, manufacturing time and/or expenses can be reduced by a higher level of quality control compared to other manufacturing techniques that is provided by the 3-D printer. For example the cost of producing joints using the method previously described may reduce manufacturing costs by at least 5%, 10%, 15%, 20%, 30%, 40%, 50%, 60%, 70%, 80%, or 90% compared to other methods. The use of 3-D printing for the manufacturing of joints to connect tubes in a space frame allows each joint to have different shape and dimensions without requiring separate molds or tools for each joint. The 3-D printing process for joints may be easily scaled.

An example of a joint that may be manufactured using the described 3-D printing method is shown in FIG. 5. The joint shown in FIG. 5 has a body portion 501 and three acceptor ports 502 exiting the joint body. The acceptor ports 502 may be locations for mating with a connecting tube. The acceptor ports may mate with a connecting tube by being inserted into an interior portion of the connecting tube and/or overlying an exterior surface of the connecting tube. The acceptor ports may have any angle relative to each other in three dimensional space. The angle of the ports relative to each other may be dictated by the chassis design. In some instances, three or more ports may be provided. The three or more ports may or may not be coplanar. The ports may be able to accept round, square, oval, or irregularly shaped tubes. Different cross-sectional shapes/dimensions for connecting tubes, ports may be configured to accommodate the different shapes/dimensions of tubes, the ports themselves may have different cross-sectional shapes/dimensions. The ports may be round, square, oval, or irregularly shaped.

The protrusion 502 may be designed such that it may be inserted in to a connecting tube. The wall thickness of the joint protrusion may be printed such that the joint is able to support the structural load calculated by a finite element model for the complete chassis design. For example a joint that needs to support a large magnitude load may have a thicker wall than a joint that supports a smaller load.

FIG. 6 shows a joint 601 connecting with three tubes 602a-c. The figure shows how the joint can be designed to connect tubes at varying angles. The angles between a set of tubes connecting to a joint may be equal or non-equal. In the example show in FIG. 6 two of the angles are labeled, the angle between tube 602a and 602b is labeled 603 and the angle between tubes 602b and 602c is labeled 604. In FIG. 6 angles 603 and 604 are not equal. Possible values for 603 and 604 can be at least 1°, 5°, 10°, 15°, 20°, 30°, 45°, 60°, 75°, 90°, 105°, 120°, 135°, 150°, 165°, or 180°.

Joints may be printed with any number of protruding acceptor ports to mate with a connecting tube. For example, the joint may have at least one, two, three, four, five, six, seven, eight, nine, ten, twelve, fifteen, twenty, thirty, or fifty acceptor ports, or prongs. The joint may have less than any of the number of acceptor ports described herein. The joint may have a number of acceptor ports falling into a range between any two of the values described herein. FIG. 7 shows an example of a joint with five protrusions. Furthermore, the protrusions may have equal or non-equal diameters. For example, FIG. 8 shows a joint 801 designed to accept tubes of different diameters with a smaller tube being accepted at the upper port 802 and larger tubes accepted at the lower ports 803. In another example, different ports on the same joint may be able to accept tubes with a diameter ratio between different tubes of 1:2, 1:3, 1:4, 1:5, 1:6, 2:3, 2:5, 2:7, 3:5, or 3:7. In the case of non-round tubes, diameter could be represented by the relevant fundamental length scale, for example side length in the case of a square tube. Additionally, tubes with different cross sectional shapes may be able to fit on to different protrusions on the same joint. For example, a joint may have protrusions with all or any combination of round, oval, square, rectangular, or irregularly shapes. In other implementations, a single joint may have protrusions with equal diameters and/or the same shape. 3-D printing of the joint may accommodate this wide array of joint configurations.

The joint may be printed such that it comprises a region of the protrusion configured to fit inside of a connecting tube and a lip to fit over the connecting tube. The joint protrusion configured to fit inside of the connecting tube may be printed such that an annular region may be formed between the surface of the protrusion and the inner diameter of the lip.

The 3-D printing method described herein may permit inclusion of fine structural features which may be impossible or cost prohibitive using other fabrication methods. For example centering features may be printed on the protrusion region of the joint. Centering features may be raised bumps or other shapes in a regular or irregular pattern on the joint protrusion. Centering features may center the joint protrusion inside of a connecting tube when a joint and tube are assembled. If adhesive is placed between the joint protrusion and the connecting tube, centering features may create fluid pathways to spread the adhesive in a desired thickness or location. In another example nipples may be printed on to the joints. Nipples may provide vacuum or injection ports for introduction of adhesive in a space between a joint protrusion and a connecting tube. In some cases, the centering features can promote even distribution of adhesive in the space between the joint protrusion and the connecting tube as described in detail elsewhere herein.

Figure 9A:
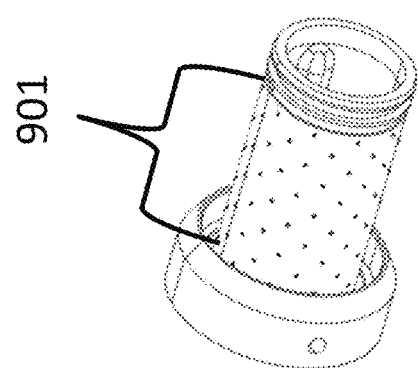
FIG. 9a-d show examples of centering features printed on joints.

Centering features may comprise a raised printed pattern on the joint protrusion designed to fit inside of a connecting tube. The centering features may be printed on the joint protrusion when the protrusion is originally formed or they may be printed on the joint protrusion some time after the joint has been designed. The centering feature may be raised from an outer surface of a protrusion of the acceptor port (tube engagement region). The height of a raised centering feature may be at least 0.001", 0.005", 0.006", 0.007", 0.008", 0.009", 0.010", 0.020", 0.030", 0.040", or 0.050". Centering features may preferably be printed on the region of the protrusion configured to fit inside of the connecting tube as shown in FIG. 9a-d. In an alternative embodiment the centering features may be printed on the lip region on the joint configured to fit over the outer diameter of the connecting tube in addition to or instead of printing the centering features on the tube engagement region. The centering features may be printed on either or both the protrusion configured to fit inside of the connecting tube and the lip region on the joint configured to fit over the outer diameter of the connecting tube FIGS. 9a-d show detailed views of four possible joint centering feature embodiments. FIG. 9a shows a small nub centering feature 901, this feature comprises a pattern of raised dots on a tube engagement region of the joint protrusion. A tube engagement region of the joint protrusion may be a portion of the joint protrusion configured to come into contact with a surface of the tube. The tube engagement region may be configured to be inserted into the tube. The dots may be provided in one or more row or column, or in staggered rows and/or columns. The raised dots may have a diameter of at least 0.001", 0.005", 0.006", 0.007", 0.008", 0.009", 0.010", 0.020", 0.030", 0.040", or 0.050".

Figure 9B:
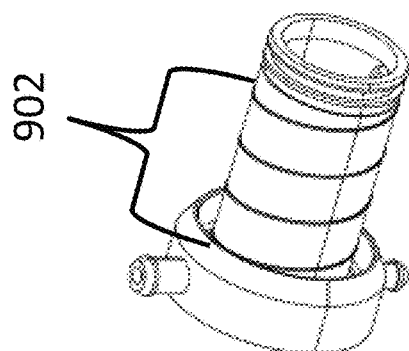

FIG. 9b shows a spiral path centering feature 902, this feature comprises a continuous raised line that winds around the full length of the tube engagement region of the joint protrusion. The continuous raised line may wrap around the tube joint protrusion a single time or multiple times. Alternative designs may comprise centering features with a raised spiral centering feature that does not wrap around the full diameter of the tube engagement region. In alternative embodiments the spiral centering feature may wind around 10°, 20°, 30°, 40°, 50°, 60°, 70°, 80°, 90°, 100°, 110°, 120°, 130°, 140°, 150°, 180°, 190°, 200°, 210°, 220°, 230°, 240°, 250°, 260°, 270°, 280°, 290°, 300°, 310°, 320°, 330°, 340°, 350°, or the full 360° of the circumference of the engagement region. The centering feature may further comprise multiple raised lines that wind around the full length of the tube without intersecting in a fashion similar to multi-start screw threads.

Figure 9C:
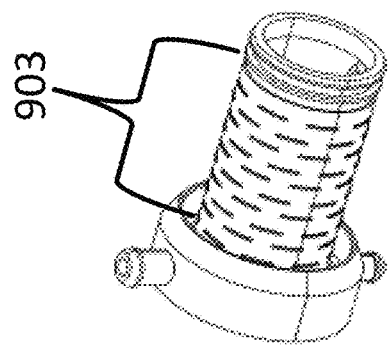

FIG. 9c shows a labyrinth centering feature 903, this feature comprises raised dashed lines circumscribing the tube engagement region of the joint at a 90 degree angle to the direction of the length of the joint protrusion. Adjacent dashed lines in the labyrinth centering feature are organized in a staggered pattern. Multiple rows of dashed lines may be provided. The dashed lines may be substantially parallel to one another. Alternatively, varying angles may be provided.

Figure 9D:
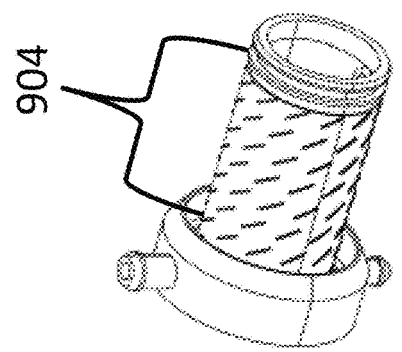

FIG. 9d shows an interrupted helix centering feature 904, this feature comprises raised dashed lines circumscribing the tube engagement region of the joint at a 45 degree angle to the direction of the length of the tube engagement region. In another example, the centering feature could have a raised line circumscribing the tube engagement region at an angle of 1°, 5°, 10°, 15°, 20°, 30°, 45°, 60°, 75°, 90°, 105°, 120°, 135°, 150°, 165°, or 180°. The dashed lines in the centering features shown in FIG. 9c and FIG. 9d may have a length of at least 0.005", 0.006", 0.007", 0.008", 0.009", 0.010", 0.020", 0.030", 0.040", 0.050" or 0.100".

Other patterns in addition to those described in FIG. 9a-FIG. 9d may be used. Alternative patterns may include dashed lines at irregular angles or spacing, a combination of lines and dots, or a group of solid lines winding around the engagement region with uniform or non-uniform spacing between the lines. In some instances, the centering features may be patterned so a direct straight line may not be drawn from a distal end of an inner protrusion to the proximal end without intersecting one or more centering feature. This may force adhesive to take a more roundabout path and encourage spreading of the adhesive, as described further elsewhere herein. Alternatively, a straight line may be provided from a distal end to a proximal end of the inner protrusion without intersecting one or more centering feature.

The centering features may be printed on the joint protrusion with different densities. For example, a joint protrusion may be printed such that 90% of the protrusion is covered with raised centering features. In the case with 90% centering feature coverage the features may be very closely spaced. Alternatively the centering features may cover at least 5%, 10%, 15%, 20%, 25%, 30%, 40%, 45%, 50%, 55%, 60%, 65%, 70%, 75%, 80%, 85%, 90%, or 95% of the protrusion. The centering features may cover less than any of the percentages described herein. The centering features may fall within a range between any two of the percentage values described herein. The density of the centering features printed on the joints may be chosen to provide a structural feature as determined from the chassis model.

The centering features may be raised such that a joint/tube assembly comprises space between an inner surface of the connecting tube and the surface of the joint protrusion designed to enter into a connecting tube. The tolerance between the inner tube diameter and the protrusion may be such that the joint and tube form a force fit connection. In the case of a force fit connection, centering features may or may not deform upon tube insertion in to the joint. The centering features may center the joint protrusion inside of a connecting tube such that the distance between the inner surface of the connecting tube and the surface of the joint protrusion may have a uniform radial thickness. Alternatively the centering features may encourage non-uniform distribution of the space between the joint protrusion and the connecting tube.

Figure 10:
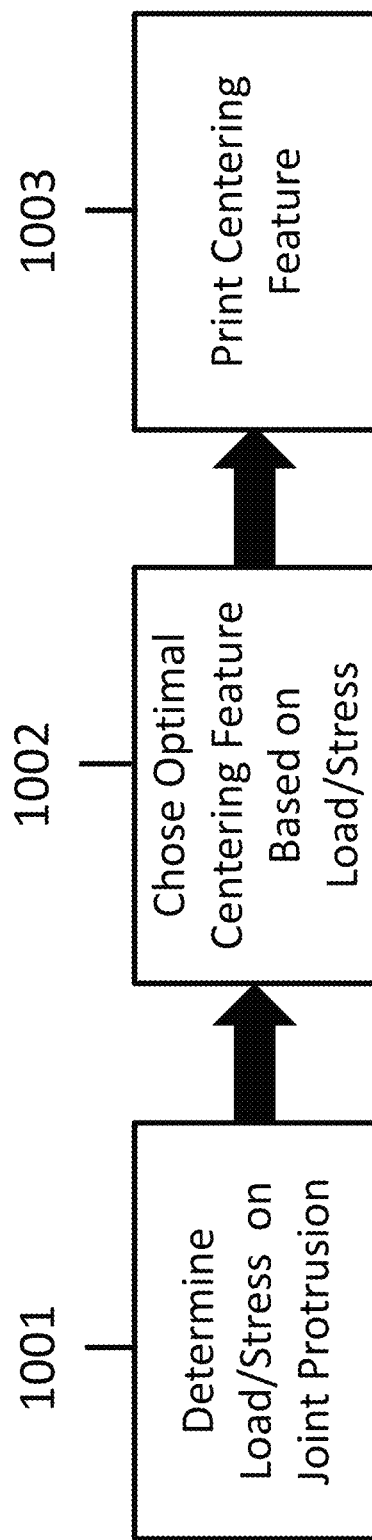
FIG. 10 shows a flow chart describing a method to choose centering features based on an expected load or stress on a joint.

Different centering features may be printed on different joints in the same chassis structure. Different centering features can be printed on different joint protrusion on the same joint. The centering features printed on a joint protrusion may be chosen so that the joint supports a stress profile determined by a finite element analysis performed on the chassis structure. An example of a method to determine a centering feature to print on a joint is shown in FIG. 10. In this method the first step 1001 is to determine the load or stress on a joint protrusion. The stress may be calculated using a finite element analysis employing a linear or non-linear stress model. Stress may be calculated on the joints while the chassis is stationary or while the chassis is moving along a typical path, for example, along a straight line, curved trajectory, flat terrain, or hilly terrain. The calculated stress on the joint may be shear, tensile, compressive, torsional stress, or a combination of stress types. The next step in the method shown in FIG. 10 is to choose a centering feature that will provide optimal structural support for the determined stress or load profile 1002. Choosing a centering feature may involve choosing any combination of pattern, dimension, and density of a possible centering feature. The final step in the process may be to print the centering feature on the joint.

For example, a joint that is expected to experience a high magnitude tension force may be printed with a small nub centering feature such that that an adhesive contact area between the joint and the tube is maximized. In another example, a joint that is expected to experience a torsional stress in the clockwise direction may be printed with a spiral centering feature in the clockwise direction to provide resistance to the torsional force.

The dimension and density of the centering features may also be chosen so that the joint supports a stress profile determined by a computational and/or empirical analysis performed on the chassis structure. The height of the centering feature may dictate the volume of the annulus formed between the surface of the joint protrusion and the inner diameter of a connecting tube. The volume of the annulus may be filled with adhesive when the joint and tube are assembled. The centering feature height may be chosen such that the volume of adhesive is optimized to support the expected stress or load on the joint. The density of centering features may also alter the volume of the annular region. For example, a joint with a high density of centering features may have a smaller volume in the annular region compared to a joint with a sparse density of centering features. The centering feature density may be chosen such that the volume of adhesive is optimized to support the expected stress or load on the joint.

Nipples for the connection of vacuum or injection tubing may be printed directly on the joint. The nipples may be printed on the joint at the time that the joint is printed such that the joint and the nipples may be carved from the same bulk material. Alternatively the nipples may be printed separately and added to the joint after it is printed. The nipples may have delicate internal pathways that may be impossible to achieve with manufacturing methods other than 3-D printing. In some cases, fluid can be delivered to an annular space between the tube accepting region of the protrusion and an inner diameter of a tube attached to the protrusion through the nipple and/or the internal pathways in fluid communication with the nipple. The fluid can be an adhesive. Adhesive may be sucked or pushed into the annular region through the printed nipples. The nipples may be positioned on opposite sides of the joint to distribute adhesive uniformly. Two or more nipples can be attached to the joint symmetrically or asymmetrically. For example, they may be provided circumferentially opposing one another on an acceptor port of a joint. They may be provided at or near a proximal end of an acceptor port for a joint. Alternatively, they may be provided at or near a distal end of an acceptor port of the joint, or any combinations thereof. A joint may have at least about 1, 2, 3, 4, 5, 10, 15, or 20 nipples on each protrusion.

Nipples can be positioned far from, in close proximity to, or co-axially with an internal joint feature such as the fluid pathway inside of a wall of the inner joint protrusion which may provide uniform adhesive coating. FIG. 11 shows a cross section of an example of a joint protrusion with nipples 1101 connecting to an internal fluid pathway 1102 inside the wall of the joint protrusion. The internal pathway may be printed in the side wall of the joint. The internal pathway may have an outlet 1103 in to the annular region. The internal pathway may introduce fluid (e.g. adhesive) into the annular region. The internal pathway may have a round cross section, a square cross section, an oval cross section, or an irregularly shaped cross section. The diameter of the internal pathway may be at least $\frac{1}{100}$", $\frac{1}{64}$", $\frac{1}{50}$", $\frac{1}{32}$", $\frac{1}{16}$", $\frac{1}{8}$", $\frac{1}{4}$", or $\frac{1}{2}$". If the internal fluid pathway has a non-round cross section the listed diameters may correspond to a relevant fundamental length scale of the cross section. The fluid pathway may run along the full length of the joint protrusion or any fraction of the length.

Nipples can be shaped and configured to connect with vacuum and/or pressure injection equipment. Printing nipples directly on the joint may decrease the need for equipment to inject adhesive in to the annular region. After adhesive is introduced the nipples may be removed from the joint by cutting or melting the nipple off of the joint.

Integrated structural features may be printed directly on to or inside of the joints. Integrated structural features may include fluid plumbing, electrical wiring, electrical buses, panel mounts, suspension mounts, or locating features. Integrated structural features may simplify the chassis design and decrease the time, labor, parts, and cost needed to construct the chassis structure. The location for the integrated structural features on each joint may be determined by the chassis model and the software may communicate with a 3-D printer to fabricate each joint with the necessary integrated structural features for a chosen chassis design.

Joints may be printed such that they comprise mounting features for shear panels or body panels of a vehicle. Mounting features on the joints may allow panels to be connected directly to a vehicle chassis frame. Mounting features on the joints may be designed to mate with complimentary mating features on the panels. For example mounting features on the joints may be flanges with holes for hardware (e.g. screws, bolts, nuts, or rivets), snaps, or flanges designed for welding or adhesive application. FIGS. 12a-c show features of the joints designed for integration with other systems on-board a structure, such as a vehicle. Joints may be designed to integrate with shear panels or body panels of a structure.

FIG. 12a shows a joint with a flange 1201. The flange 1201 may be used to connect to a shear panel or body panel (not shown). In the case of use of the joint members to construct a vehicle chassis, the joint member may be integrated with a suspension system. A suspension system may comprise hydraulic, air, rubber, or spring loaded shock absorbers. The suspension system may connect to the joint member by an attachment to a flange 1201. The flange may be printed such that it contains at least one hole 1202 for mating with connecting hardware (e.g. screw, nail, rivet).

Joints may be printed such that they include integrated passageways for electrical connections. Electrical connections integrated into the joints may be electrically insulated. Electrical connections integrated into the joints may be grounded. Electrical connections integrated into the joints may be in communication with wiring routed through the tubes connected to the joint. The electrical wiring may be used to provide power to systems on board a vehicle and/or to provide power to a battery to start or run the vehicle engine. Systems on board a vehicle that use power from the integrated joints may include, navigation, audio, video display, power windows, or power seat adjustment. Power distribution within a vehicle may travel exclusively through a tube/joint network. FIG. 12*b* shows a possible joint embodiment for routing of electrical wires throughout a structure. The joint shown in FIG. 12*b* has with an inlet region 1203; this inlet could be used for insertion of electrical connections or wires. Electrical wires may be inserted into the inlet region and routed from the joint to the tube for transmission throughout the chassis. One or more system that may be powered using the electrical wires may connect with the wire through the inlet region. The electrical connections integrated into the joints can provide plugins that permit a user to plug in one or more devices to obtain power for the device. In some cases, one or more electrical contacts can be printed onto the joints before, after, or during 3-D printing of the joints.

Joints may be printed such that they comprise an integrated heating and cooling fluid system to provide heat and air conditioning in the vehicle chassis. Other applications may include cooling and/or heating various components of the vehicle. Integration of fluid (e.g. gas or liquid) systems into the joint/tube construction may partially or fully eliminate the need for conventional air ducts and plumbing from vehicle design. Joints may route hot or cold fluid from a production source (e.g. electric heating element, engine block heat exchanger, refrigerator, air conditioning unit, or boiler) to a location in the chassis where a passenger or vehicle operator may wish to heat or cool the interior. Joints may contain integrated components to intake hot or cold fluid from a source, distribute hot or cold fluid, and vent hot or cold fluid at a location away from the source. Joints and tubes in the assembly may be thermally insulated using fiberglass, foam insulation, cellulose, or glass wool. The joint and tube assembly may be fluid tight. In the case of a joint comprising an integrated fluid system the joint embodiment shown in FIG. 12*b* may be used. An inlet such as the one illustrated in the FIG. 1203 may be used to route fluid for heating or cooling throughout a structure by means piping the fluid between a plurality of joints through the connector tubes.

A cross sectional view of a joint that may be used for routing of fluid or electricity is shown in FIG. 12*c*. In the example shown in FIG. 12*c* two joint protrusions are joined by an internal passageway 1204. In an embodiment the joint in FIG. 12*c* may route fluid or wiring from the inlet at 1205 to the outlet at 1206. The passageways used for routing of fluid and electricity may be the same passageways or they may be separate. Internal joint routing may keep two or more fluids separate within a joint while still providing desired routing between tubes, or from tube to joint-mounted connectors or features.

Joints may be printed such that they include integrated locating or identifying features. The features may enable automated identification or handling of the joints during assembly and processing. Examples of locating features may include a cylindrical boss (e.g. a boss with a flat and radial groove), an extruded C-shape with a cap, a bayonet or reverse bayonet fitting with a non-symmetric pin pattern, a hook feature, or other features with geometry that may uniquely define the feature orientation and position when examined. These locating features may be interfaced to or grasped by robotic grippers or work holding tools. The interface of the joint may be fully defined once the grasping motion begins, is partially finished, or is complete. The locating features may enable repeatable and optionally automated positioning of the joints prior to and during space frame assembly. The defining geometry of the features may also enable automated systems to coordinate the motion of multiple joints along defined paths in space during insertion of tubes into the joints. At least two tubes may be inserted into multiple joints in parallel without resulting in geometric binding during assembly. The integrated locating feature may further comprise integral identifying features. For example identifying features may be a one dimensional bar code, a two dimensional QR code, a three dimensional geometric pattern, or a combination of these elements. The identifying feature may encode information about the joint to which it is attached. This joint information may include: geometry of the joint, including the orientation of the tube entries relative to the identifying/location feature; material of the joint; positioning of adhesive injection and vacuum ports relative to the identifying/locating features; adhesive required by the joint; and joint tube diameters. The combined identifying/locating feature may enable automated positioning of joints for assembly without requiring external information to be supplied to the automated assembly cell.

Any of the features described herein may be printed with the rest of the joint. For example, the entire joint including the various features described herein (e.g., centering features, nipples, passageways, etc.) may be printed in a single step and formed a single integral material. Alternatively, specific features may be printed onto a pre-existing joint component. For example, a center feature may be printed onto an existing acceptor port.

The 3-D printing method of joint fabrication may be a high efficiency manufacturing process. A single set of equipment may be configured to generate a variety of joint geometries with varying detailed features. The production may have lower time and cost requirements compared to traditional manufacturing methods, furthermore the process may be easily scaled from small volume production to large volume production. The process may provide superior quality control over traditional manufacturing methods which may reduce waste associated with misshapen parts and the time required to re-make parts which may not meet a standard of quality control.

While preferred embodiments of the present invention have been shown and described herein, it will be obvious to those skilled in the art that such embodiments are provided by way of example only. It is not intended that the invention be limited by the specific examples provided within the specification. While the invention has been described with reference to the aforementioned specification, the descriptions and illustrations of the embodiments herein are not meant to be construed in a limiting sense. Numerous variations, changes, and substitutions will now occur to those skilled in the art without departing from the invention. Furthermore, it shall be understood that all aspects of the invention are not limited to the specific depictions, configurations or relative proportions set forth herein which depend upon a variety of conditions and variables. It should be understood that various alternatives to the embodiments of the invention described herein may be employed in practicing the invention. It is therefore contemplated that the invention shall also cover any such alternatives, modifications, variations or equivalents. It is intended that the following claims define the scope of the invention and that methods and structures within the scope of these claims and their equivalents be covered thereby.

What is claimed is:

1. A vehicle chassis comprising:
   a plurality of connecting tubes; and
   a plurality of joint members produced by a 3-D printer, each joint member sized and shaped to mate with at least a subset of the plurality of the connecting tubes in the plurality of connecting tubes to form a three-dimensional frame structure,
   wherein the plurality of joint members comprise 3-D printed mounting features, the mounting features providing panel mounts for mounting of panels on the three-dimensional frame structure.

2. The vehicle chassis of claim 1, wherein each joint member of the plurality of joint members is sized and shaped such that the joint member contacts an inner surface and an outer surface of a connecting tube when the connecting tube is mated to the joint member.

3. The vehicle chassis of claim 1, wherein at least one joint member of the plurality of joint members comprises internal routing features formed during 3-D printing of the joint member.

4. The vehicle chassis of claim 3, wherein the internal routing features provide a network of passageways for transport of fluid through the vehicle chassis when the three-dimensional frame structure is formed.

5. The vehicle chassis of claim 3, wherein the internal routing features provide a network of passageways for transport of electricity through electrical components throughout the vehicle chassis when the three-dimensional frame structure is formed.

6. The vehicle chassis of claim 1, wherein at least one of the plurality of joint members comprises one or more 3-D printed nipples.

7. The vehicle chassis of claim 6, wherein the one or more 3-D printed nipples comprise a pathway for adhesive injection or vacuum infusion.

8. The vehicle chassis of claim 7, wherein the at least one of the plurality of joint members comprises nipples positioned on opposite sides of the joint member.

9. The vehicle chassis of claim 7, wherein the at least one of the plurality of joint members comprises a protrusion for mating with a corresponding connecting tube.

10. The vehicle chassis of claim 9, wherein the one or more 3-D printed nipples are configured to connect with injection equipment to distribute adhesive into a space between the protrusion and the corresponding connecting tube.

11. The vehicle chassis of claim 9, wherein the at least one of the plurality of joint members further comprises a lip configured to fit over an outer diameter of the corresponding connecting tube wherein the protrusion is configured to fit inside the corresponding connecting tube.

12. The vehicle chassis of claim 11 wherein an annular region is formed between a surface of the protrusion and an inner diameter of the lip.

13. The vehicle chassis of claim 12, wherein the one or more 3-D printed nipples are configured to allow injection of adhesive or creation of vacuum in the annular region.

14. The vehicle chassis of claim 9, wherein a surface of the protrusion comprises a plurality of centering features disposed thereon.

15. The vehicle chassis of claim 14, wherein the plurality of centering features are configured to create fluid pathways to spread adhesive injected via one of the 3-D printed nipples.

16. The vehicle chassis of claim 1, wherein at least one of the plurality of joint members comprises mounting features for shear panels or body panels.

17. The vehicle chassis of claim 1, wherein the mounting features comprise a flange.

* * * * *